United States Patent
Best

[19]

[11] Patent Number: 5,929,671
[45] Date of Patent: *Jul. 27, 1999

[54] WAVEFORM GENERATOR

[75] Inventor: Scott C. Best, Sunnyvale, Calif.

[73] Assignee: Cypress Semiconductor Corporation, San Jose, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/596,463

[22] Filed: Feb. 5, 1996

[51] Int. Cl.[6] ...................................................... H03K 4/06
[52] U.S. Cl. ........................ 327/132; 327/131; 327/140; 327/309
[58] Field of Search ..................................... 327/129, 130, 327/131, 132, 134, 111, 140, 180, 309

[56] References Cited

U.S. PATENT DOCUMENTS

| | | | |
|---|---|---|---|
| 4,728,813 | 3/1988 | Diller | 307/228 |
| 4,908,526 | 3/1990 | Mefford | 327/180 |
| 5,140,591 | 8/1992 | Palara et al. | 327/130 |
| 5,189,313 | 2/1993 | Garuts | 307/263 |
| 5,394,020 | 2/1995 | Nienaber | 327/140 |
| 5,642,067 | 6/1997 | Grace | 327/130 |

Primary Examiner—Tim Callahan
Assistant Examiner—Jung Ho Kim
Attorney, Agent, or Firm—Oblon, Spivak, McClelland, Maier & Neustadt, P.C.

[57] ABSTRACT

A novel waveform generating for generating a waveform having symmetrical rise and fall times. The waveform generator of the present invention includes a first current source, a second current source, a MOS capacitor and a clamping circuit. The first current source and the second current source are coupled to a node such that current generated by the first current source flows into the capacitor and current generated by the second current source flows out of the capacitor. The clamping circuit is also coupled to the node such that the output voltage generated by the waveform generator is limited to a minimum and a maximum value. Therefore, by controlling the current flowing into the node, and the capacitance at the node, the rate at which the output voltage changes over time is controlled. As such, a waveform having very precise rise and fall times is generated.

10 Claims, 6 Drawing Sheets

WAVEFORM GENERATOR

BACKGROUND OF THE INVENTION

1. Field of the Invention

The present invention relates generally to the field of integrated circuits. More particularly, the present invention relates to the field of waveform generators.

2. Discussion of Related Art

Often times it is desirable to generate waveforms having very precise rise and fall times. For example, very precise rise and fall times in communication applications such as an Ethernet application may be required to eliminate the higher frequency harmonics. In an Ethernet application, an input waveform having a very sharp rise and fall time (e.g. a rectangular wave having a nearly infinite slope) will capture the higher frequency harmonics (e.g. 30, 50, 70 Megahertzs) that are present on the signals but by slowing down the rise and fall times of the waveform (e.g. a trapezoidal waveform having a gradual slope), the higher frequency harmonics are eliminated and the lower frequency harmonics (e.g. 10 Megahertz) are captured.

Figure 1:
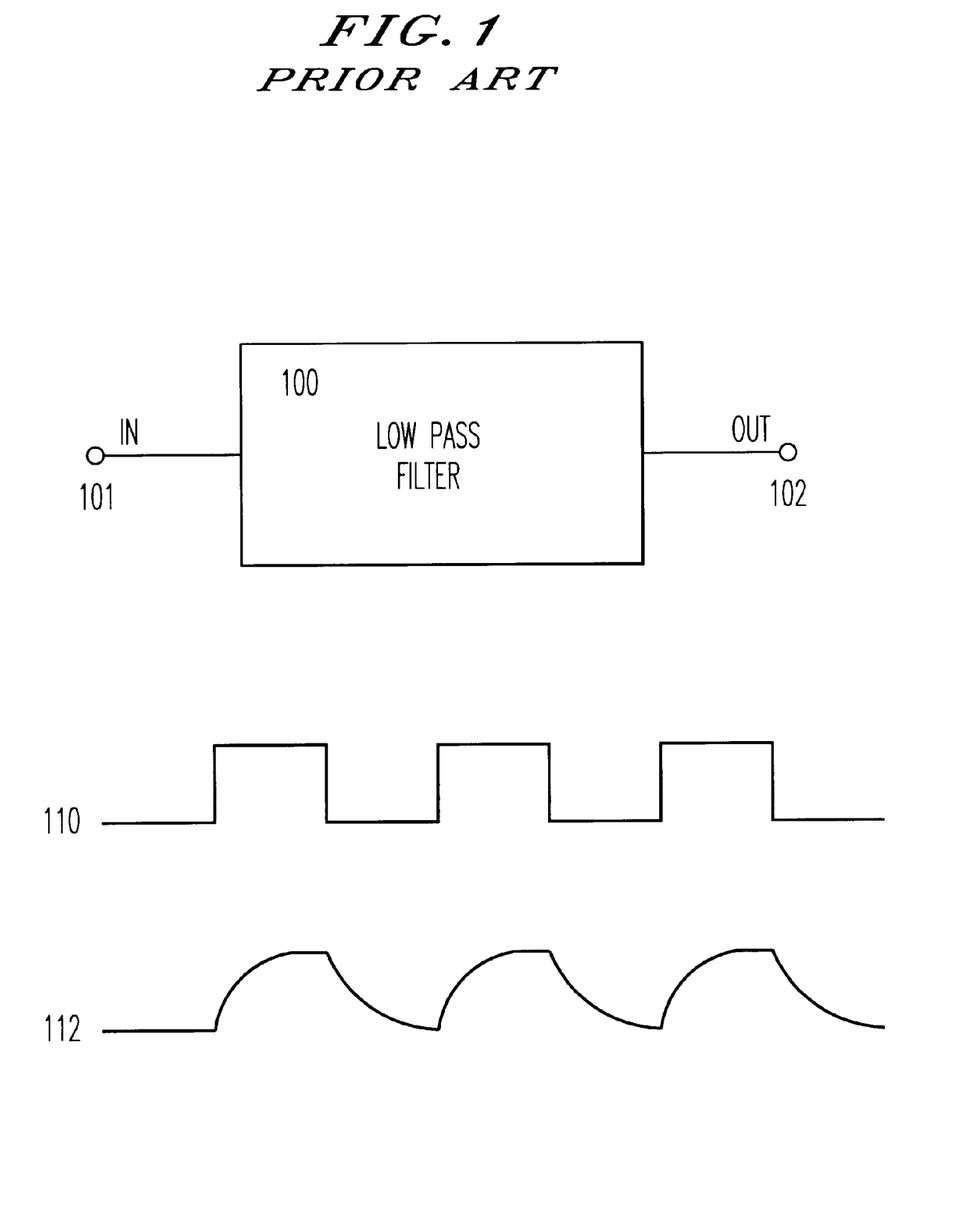
FIG. 1 is an illustration of a prior art Low Pass Filter used to generate a waveform.

Typically, waveshaping and filtering techniques are used to generate waveforms having a desired slope. In the prior art shown in FIG. 1, a Low Pass Filter 100 receives an a pulse waveform 110 at Input 101 and generates a waveform 112 at Output 102. The Low Pass Filter 100 passes signal frequencies of interest while rejecting undesired signal frequencies. Although the Low Pass Filter 100 reduces the rise and fall time of the input waveform 110, the output waveform generated does not have symmetrical rise and fall times as shown in FIG. 1. The curvature of the output waveform 112 is a result of the transient response of the Low Pass Filter 100. For certain applications, the waveform generated by the Low Pass Filter 100 does not provide a waveform having rise and fall times that are precise enough to function properly in the application.

Figure 2A:
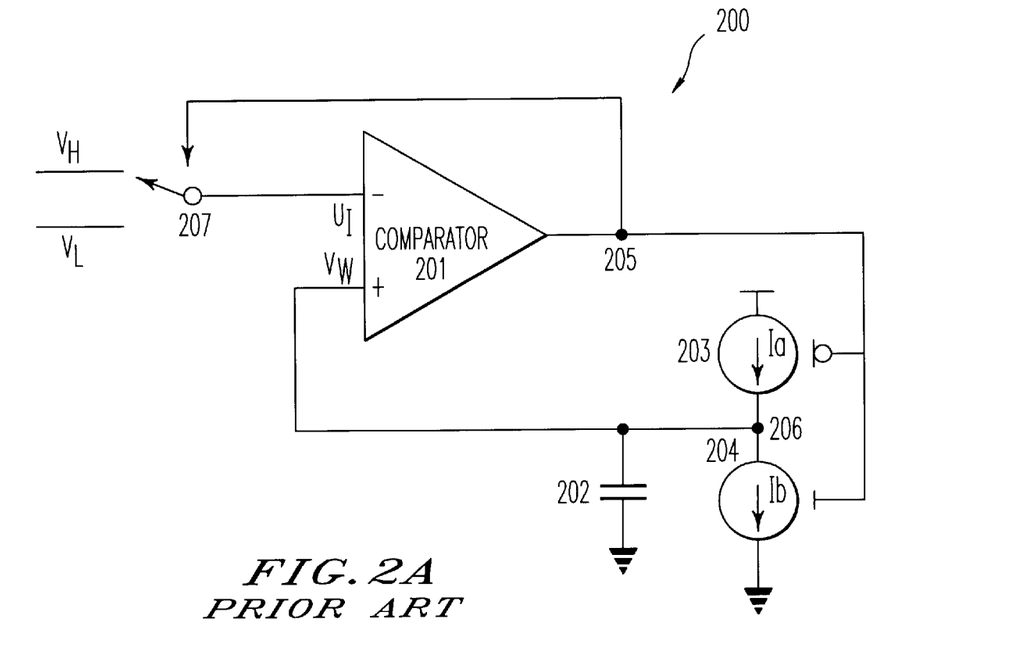
FIG. 2a is an illustration of a prior art waveform shaper for generating a free-running triangular waveform.
Figure 2B:
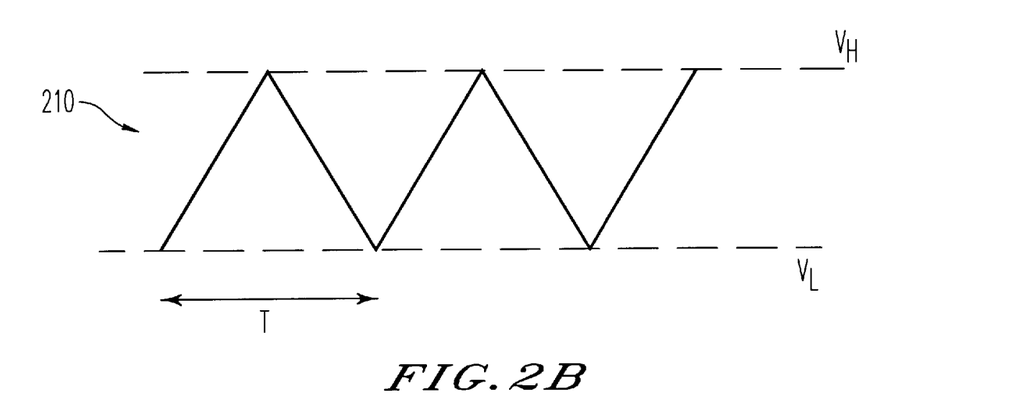

FIG. 2a illustrates a waveform generator 200 that utilizes a comparator 201 to generate the free running triangular output signal 210 shown in FIG. 2b. Note that the signal 210 generated by the waveform generator 200 is a symmetrical waveform having rise and fall times with opposite slopes. Generally, a comparator compares the input voltage $\upsilon_I$ with a waveform voltage $V_W$ that constitutes the comparator threshold. The waveform voltage $V_W$ is generated by the feedback loop which includes the current sources 203 and 204 and the capacitor 202. If the input voltage $\upsilon_I$ is greater than the waveform voltage $V_W$, the comparator provides a high level output at node 205. Alternatively, if the input voltage $\upsilon_I$ is less than the waveform voltage $V_W$, the comparator provides a low level output at node 205. The voltage at node 205 is coupled to the inverting input voltage $\upsilon_I$ of the comparator 201 whose non-inverting input is coupled to node 206. The output signal 210 in FIG. 2b has a maximum amplitude of $V_H$ and a minimum amplitude of $V_L$ over a period T.

When the voltage at node 205 is at a high level, the current source 204 is enabled and the current source 203 is disabled. Also, the switch 207 has coupled $\upsilon_I$ to $V_L$, to the low voltage reference. Typically, each of the current sources 204 and 203 generate the same amount of current when enabled. When this occurs, the current $I_b$ generated by current source 204 flows out of node 206 and out of the capacitor 202 causing the waveform voltage $V_W$ to decrease. The comparator 201 then compares the waveform voltage $V_W$ with the input voltage $\upsilon_I$ and generates an output voltage at node 205. Thus, when the waveform voltage $V_W$ decreases past the input voltage $\upsilon_I$, the output of the comparator at 205 will change state from high to low.

When the voltage at node 205 is low, the current source 203 is enabled and the current source 204 is disabled. Additionally, the switch 207 couples $\upsilon_I$ to $V_H$, the high voltage reference. When this occurs, the current $I_a$ generated by the current source 203 flows into node 206 and into the capacitor 202, charging it up and increasing the waveform voltage $V_W$. The comparator 201 compares the waveform voltage $V_W$ with the input voltage $\upsilon_I$, the output of the comparator at 205 will change state from low to high.

Although the waveform generator 200 in FIG. 2 generates a triangular output signal having symmetrical rise and fall times, the waveform generator 200 is free running. The circuit in the present invention is desirable for applications that require a waveform having symmetrical rise and fall times that operate in response to an input signal such as a rectangular pulse waveform. Furthermore, the output signal may be a trapezoidal waveform having a specified offset value and a specified amplitude.

SUMMARY OF THE INVENTION

The present invention provides a method and apparatus for generating a waveform having symmetrical rise and fall times. The apparatus of the present invention in one embodiment includes a waveform generator having a first current source, a second current source, a MOS capacitor and a clamping circuit. The first current source and the second current source are coupled to a node such that the first current source continually generates current that flows into the capacitor, and the second current source, when enabled, generates current that flows out of the capacitor. The clamping circuit is also coupled to the node such that the output voltage generated by the waveform generator is limited to a minimum and a maximum value. Therefore, by controlling the current flowing into the node, the capacitance at the node and the minimum and maximum voltage at the node, the rate at which the output voltage changes over time is controlled. As such, a waveform having very precise rise and fall times is generated.

The method of the present invention includes the steps of generating a waveform having symmetrical rise and fall times. In one embodiment a plurality of current sources coupled to a node is provided such that the current generated by the plurality of current sources flows into or away from the node. Next, the present invention receives an input voltage signal to enable or disable at least one of the plurality of current sources. By enabling or disabling at least one of the plurality of current sources, the amount of current flowing into or away from the node is controlled. The capacitor coupled to the node is either charged or discharged, depending on the amount of current flowing into or away from the node. If the amount of current flowing out of the node is greater than the amount of current flowing into the node, the capacitor is discharged. On the other hand, if the amount of current flowing into the node is greater than the amount of current flowing out of the node, the capacitor is charged. Resultingly, the output voltage signal will have nearly identical rise and fall times with opposite slopes.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which:

FIG. 2b is an illustration of the output waveform of the prior art waveform shaper in FIG. 2a.

FIG. 3b is a more detailed illustration of the output waveform in FIG. 3a.

DETAILED DESCRIPTION OF THE PRESENT INVENTION

The following detailed description sets forth an embodiment or embodiments in accordance with the present invention for a method and apparatus for a novel waveform generator. In the following description details are set forth such as specific circuitry configurations in order to provide a thorough understanding of the present invention. It will be evident, however, that the present invention may be practiced without these details. In other instances, the functioning of well-known circuit components, logic gates, etc., have not been described in particular detail so as not to obscure the present invention.

Figure 3A:
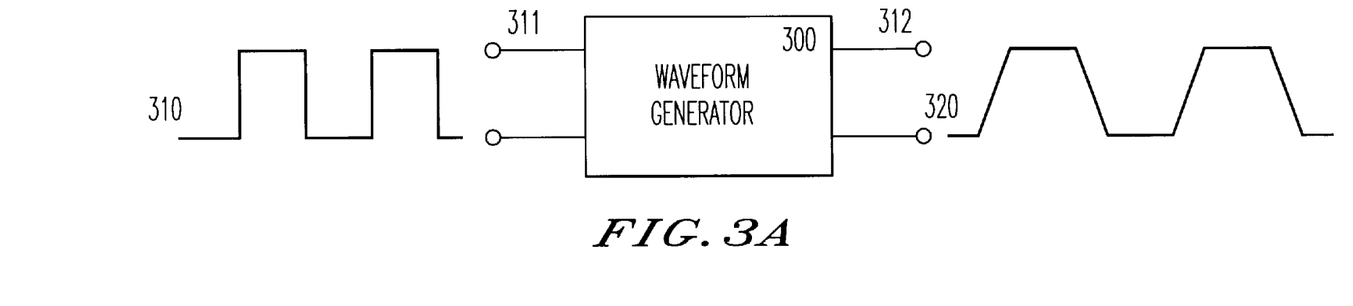
FIG. 3a is an illustration of an input and an output waveform of the present invention.

The present invention is a novel waveform generator for generating an output waveform having symmetrical rise and fall times. The waveform generator 300 in FIG. 3a receives a pulse waveform 310 at the input 311 of the waveform generator. The pulse waveform is also referred to as a rectangular waveform having a very sharp or infinite slope. The waveform generator 300 generates an output waveform 320 at the output 312 of waveform generator 300. According to FIG. 3a, the output waveform is a trapezoidal waveform having a rise and fall time with a finite slope. Therefore, the very sharp slope of the input pulse 310 is slowed down such that the output waveform 320 gradually changes from the low voltage level to the high voltage level over a period of time referred to as the rise time, and changes from the high voltage level to the low voltage level over a period of time referred to as the fall time. As previously discussed, the very precise rise and fall times of waveform 320 are desirable for certain communication applications.

Figure 3B:
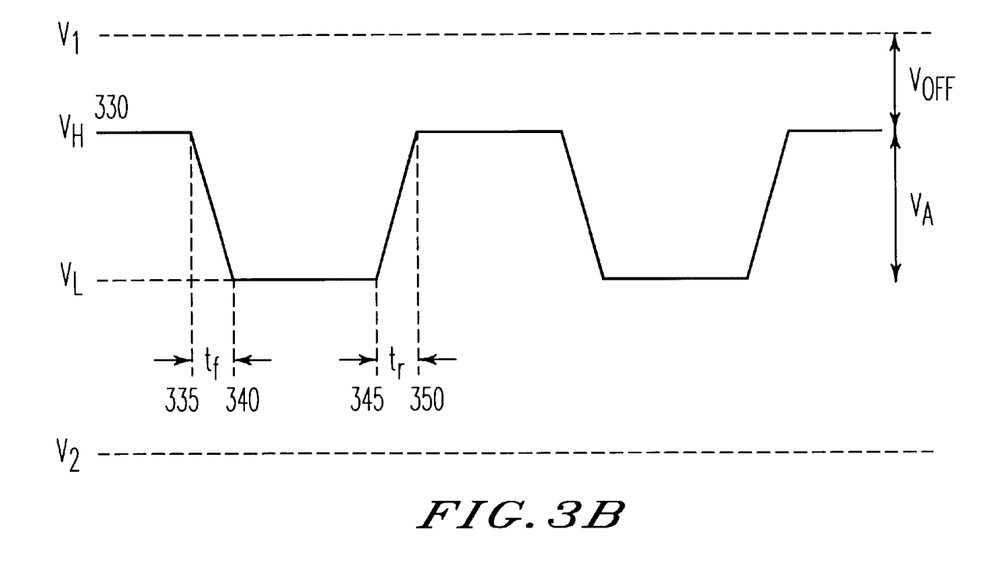

FIG. 3b is a more detailed illustration of the output waveform 320. In one embodiment of the present invention, the output voltage signal has a possible swing between voltage $V_1$ and voltage $V_2$. The trapezoidal waveform 330 has an amplitude $V_A$ which is measured between the high voltage level $V_H$ and the low voltage level $V_L$. Furthermore, the trapezoidal waveform 330 has a fall time shown by $t_f$ and a rise time shown by $t_r$. The fall time $t_f$ is the period between 335 and 340 and refers to the time it takes for the waveform 330 to transition from the high voltage level $V_H$ to the low voltage level $V_L$. The rise time $t_r$ is the period between 345 and 350 and refers to the time that it takes the waveform 330 to transition from the low voltage level $V_L$ to the high voltage level $V_H$. As shown in FIG. 3b, the rise time $t_r$ and the fall time $t_f$ are symmetrical because the rise time $t_r$ and fall times $t_f$ have opposite slopes. Also illustrated in FIG. 3b is the offset voltage of the waveform 330. The offset voltage $V_{OFF}$ is the voltage between $V_1$ and $V_H$. In one embodiment $V_1$ equals 0 volts and $V_2$ equals −9 volts. Assuming that the offset voltage is 2 volts and the voltage amplitude $V_A$ is 5 volts, then $V_H$ equals −2 volts and $V_L$ equals −7 volts. Furthermore, assume that the fall time and the rise time are both 2 nanoseconds (ns). Therefore, the slope of the rise time $t_r$ is 2.5v/ns and the slope of the fall time $t_f$ is −2.5v/ns.

Figure 4:
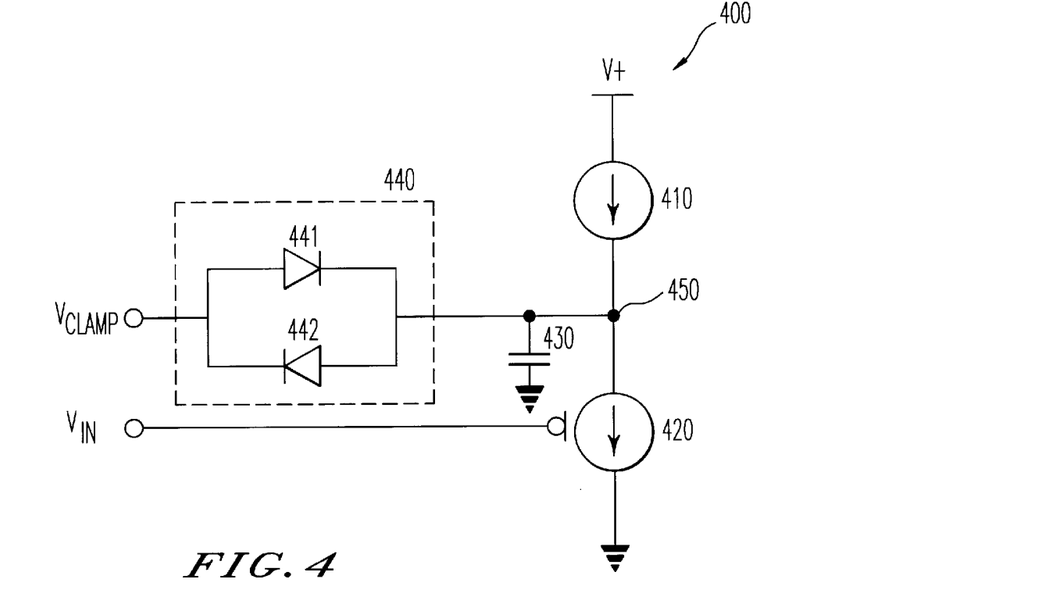
FIG. 4 is an illustration of one embodiment of the waveform generator in the present invention.

FIG. 4 is an illustration of one embodiment of the waveform generator of the present invention for generating a voltage waveform having symmetrical rise and fall times. The waveform generator 400 includes a first current source 410, a second current source 420, a capacitor 430 and a clamping circuit 440. The first current source 410 is coupled to a voltage terminal V+ and to a node 450 such that the current source 410 generates current that flows from the voltage terminal V+ to the node 450. The second current source 420 is also coupled to the node 450, but generates current that flows away from the node 450 to a voltage terminal at ground. The enable input of the second current source 420 is coupled to an input voltage signal $V_{IN}$. Typically, the input voltage signal $V_{IN}$ is a pulse shaped waveform 310 as shown in FIG. 3. In one embodiment of the present invention, the pulse shape waveform has a high voltage level and a low voltage level such that when the pulse shaped waveform is at its high voltage level, the second current source 420 is disabled, and when the pulse shaped waveform is at its low voltage level, the second current source 420 is enabled. This is referred to as a negative enable input. In an alternative embodiment, the second current source 420 has a positive enable input. Note that when the second current source 420 is disabled, the second current source 420 does not generate any current and when the second current source 420 is enabled, the second current source 420 generates current that flows away from node 450 and out through the voltage terminal coupled to ground.

The capacitor 430 is also coupled to node 450 such that the voltage at node 450 will increase linearly in response to the total amount of current flowing into or out of node 450. For example, if the first current source 410 generates 1 milliamp (mA) of current and the second current source 420 is enabled to generate 2 mA of current, then there is a net of 1 mA of current flowing out of node 450. When the current flowing out of node 450 is 1 mA, the capacitor voltage will discharge linearly with a slope equal to the ratio of the current (1 mA) divided by the capacitor size (slope=I/c). In this way, the slope of the waveform signal can be precisely controlled by adjusting the size of the capacitor and the amount of current flowing in the current sources.

However, when the second current source 420 is disabled, the current flowing into node 450 from the first current source is 1 mA and the current flowing out of node 450 is reduced to 0 mA. In this situation, the voltage at the capacitor 430 will increase with a slope equal to the ratio of the current (1 mA) to the capacitor size.

The clamping circuit 440 is also coupled to node 450. The clamping circuit 440 includes two diodes coupled in antiparallel. The input of diode 441 and the output of diode 442 are coupled to the input of the clamping circuit 440. In this example, the voltage at $V_{clamp}$ is chosen such that the two current sources 410 and 420 remain operational over the full voltage swing of node 450. The clamping circuit 440 limits the voltage at node 450 by determining the maximum and minimum value of a voltage at node 450. In other words, the maximum voltage at node 450 is the voltage level of the clamping voltage signal $V_{clamp}$ plus the voltage drop across the diode 441 and the minimum voltage is the voltage level of the clamping voltage signal $V_{clamp}$ minus the voltage drop across diode 442. Therefore, by controlling the current flowing into and out of node 450 from the first and second current sources and the capacitance at node 450, the rate at which the voltage at node 450 changes over time can be controlled in such a manner as to generate an output waveform having a very precise rise time and fall time.

Figure 5:
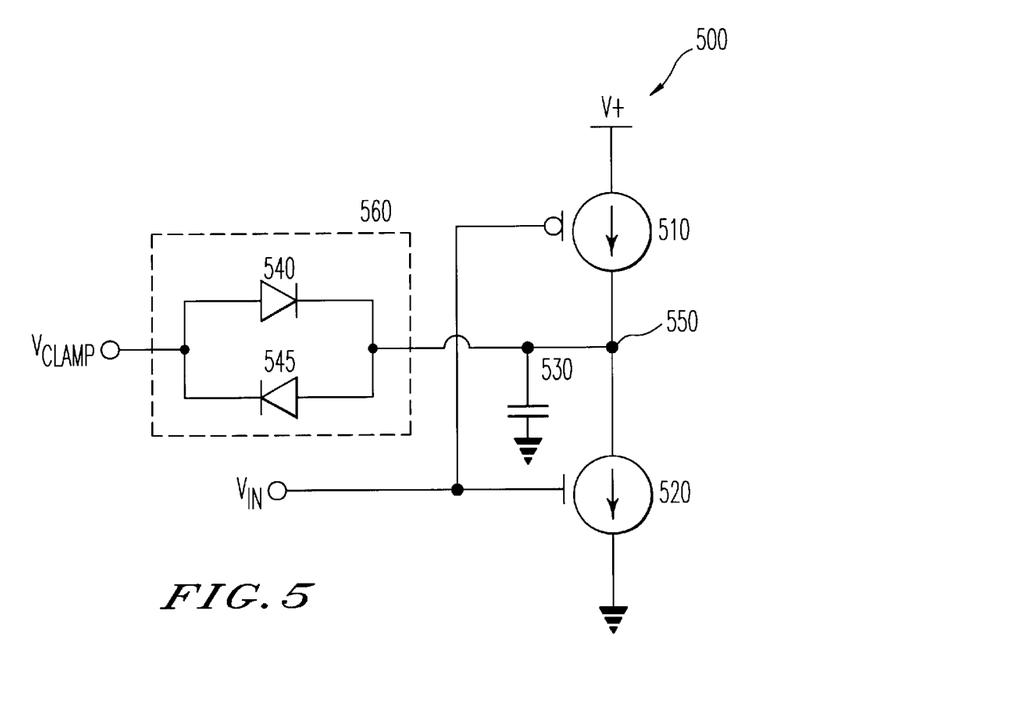
FIG. 5 is an illustration of an alternative embodiment of the waveform generator in the present invention.

FIG. 5 is an alternative embodiment of the present invention that generates an output voltage waveform having a very precise rise and fall time. The waveform generator 500 is similar to the waveform generator 400 in FIG. 4. However, unlike the waveform generator 400, the first current source 510 and the second current source 520 both have enable inputs. According to FIG. 5, the first current source 510 and the second current source 520 both have enable inputs coupled to the input voltage signal $V_{IN}$. In one embodiment, the first current source 510 and the second current source 520 each generate 1 mA of current when enabled. The input voltage signal $V_{IN}$ is a pulse shaped waveform having a low voltage level and a high voltage level such that the first current source 510 is enabled when the input voltage signal $V_{IN}$ is at a low voltage level and disabled when the input voltage signal $V_{IN}$ is at a high voltage level. On the other hand, the second current source 520 is enabled when $V_{IN}$ is at a high voltage level and disabled when the voltage input signal $V_{IN}$ is at a low voltage level. When the first current source 510 is enabled, the waveform generator 500 generates current that flows from a voltage terminal V+ into node 550 and when the second current source 520 is enabled, the waveform generator 500 generates current that flows away from node 550 and toward the voltage terminal coupled to ground.

Furthermore, when the first current source 510 is enabled to generate current flowing into node 550, then the capacitor 530 charges. As the capacitor 530 charges, the voltage at node 550 will increase in a linear fashion. On the other hand, when the second current source is enabled to generate current flowing away from node 550, then the capacitor 530 discharges and the voltage at node 550 will decrease in a linear fashion.

The minimum and maximum voltage at node 550 is limited by the clamping circuit 560 which includes diodes 540 and 545. The input of diode 540 and the output of diode 545 are coupled to the input of the clamping circuit 560 which receives the clamping voltage signal $V_{clamp}$. The output of diode 540 and the input of diode 545 are coupled to the output of the clamping circuit 500 at node 550. The clamping circuit 560 limits the maximum voltage at node 550 to the voltage level of the clamping voltage signal $V_{clamp}$ plus the voltage drop across the diode 540. The clamping circuit 560 limits the minimum voltage at node 550 to the voltage level of the clamping voltage signal $V_{clamp}$ minus the voltage drop across the diode 545. Therefore, by controlling the current flowing through node 550 from the first and second current sources 510 and 520, the capacitance at node 550, the rate at which the output voltage waveform changes with respect to time can be controlled to generate an output waveform having very precise rise and fall times.

Figure 6:
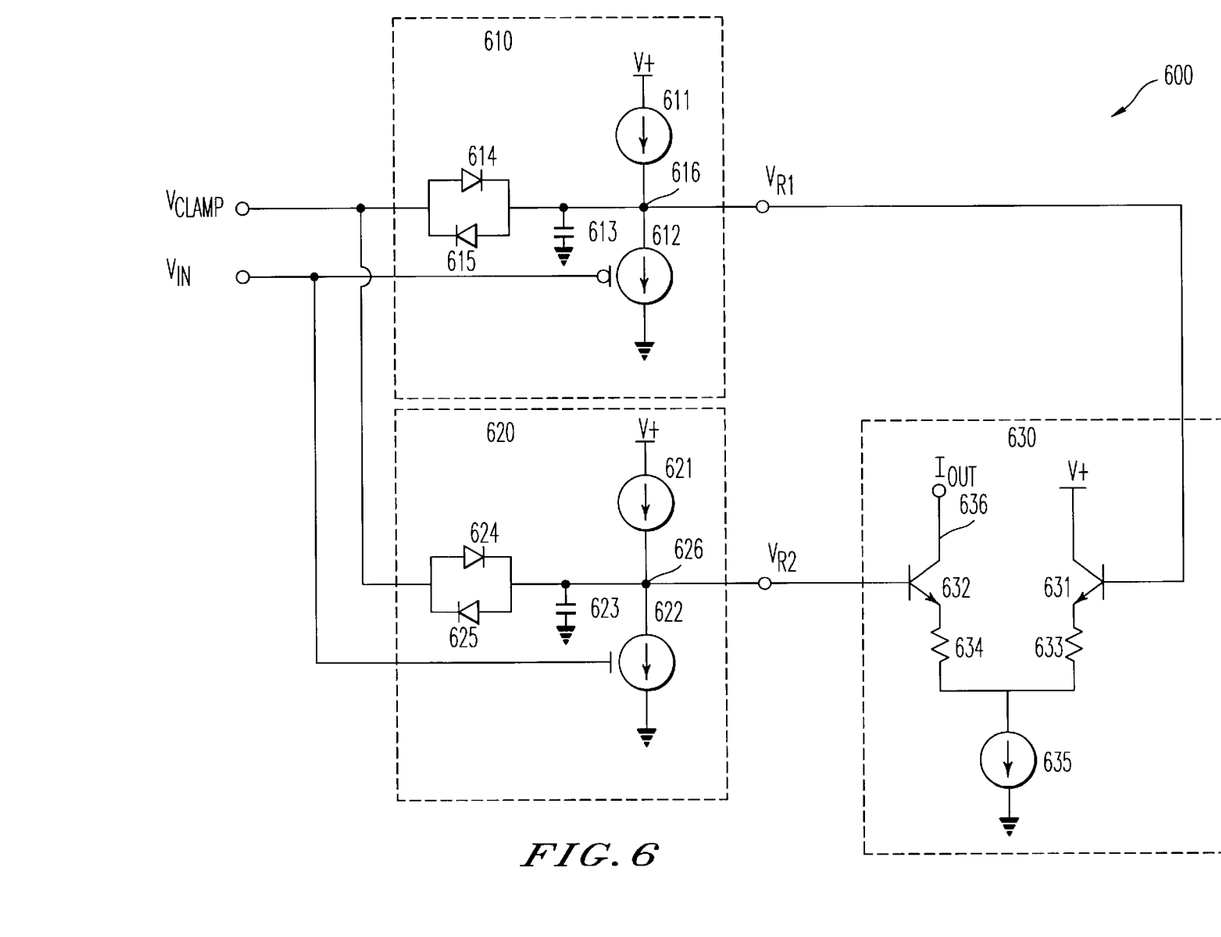
FIG. 6 is an illustration of one embodiment of the present invention for converting the trapezoidal voltage waveform into a current waveform.

FIG. 6 is an embodiment of the current waveform generator 600. The current waveform generator 600 generates a current waveform that is identical in phase to the voltage waveform described in conjunction with FIGS. 4 and 5. The waveform generator 600 includes two voltage waveform generators 610 and 620 that generate complementary output voltage waveforms. Although the voltage waveform generator 400 is used in the current waveform generator 600, an alternative embodiment may substitute the voltage waveform generator 500 in place of the voltage waveform generator 400.

The voltage waveform generator 610 is identical to the voltage waveform generator 400, and the voltage waveform generator 620 is similar to the voltage waveform generator 400 with the exception that the second current source has a positive enable input. The voltage waveform generator 610 includes the first current source 611, the second current source 612, the capacitor 613 and the clamping circuit comprised of diodes 614 and 615. The voltage waveform generator 620 includes the first current source 621, the second current source 622, the capacitor 623 and the clamping circuit comprised of diodes 624 and 625. The input of the clamping circuit in the voltage waveform generators 610 and 620 receives the clamping voltage signal $V_{clamp}$. The negative enable input of the first current source 612 and the positive enable input of the second current source 622 both receive the input voltage signal $V_{IN}$. Typically, the input voltage signal is a rectangular or pulse-shaped waveform.

The output of the voltage waveform generator 610 at node 616 and the output of the voltage waveform generator 620 at node 626 are both coupled to the voltage-to-current converter 630. The output voltage signals $V_{R1}$ at node 616 and $V_{R2}$ at node 626 are received by the voltage-to-current converter 630 which generates an output current signal $I_{out}$ which is measured at node 636. In this particular embodiment, the voltage-to-current converter is a differential amplifier.

The voltage-to-current converter 630 is comprised of the bipolar transistor 631 and 632, the resistors 633 and 634, and the current source 635. The collector of transistor 631 is coupled to the voltage terminal V+, the base of transistor 631 is coupled to $V_{R1}$, and the emitter of transistor 631 is coupled to the current source 635 via resistor 633. Furthermore, the collector of transistor 632 drives the output drives the output of current seen at $I_{out}$. The base of transistor 632 is coupled to $V_{R2}$ and the emitter of transistor 632 is coupled to the current source 635 via resistor 634. The current source 635 generates current that flows out of the node coupled to resistors 533 and 634 toward a voltage terminal coupled to ground. The differential amplifier 630 is designed such that the gain, $G_m$, is approximately equal to one. In this embodiment, the output current waveform measurable at $I_{out}$ has a trapezoidal-shaped waveform having symmetrical rise and fall times and the same phase as the output voltage signal $V_{R2}$. It is appreciated that in an alternative embodiment the output current at $I_{out}$ has the same phase as the output voltage waveform $V_{R1}$. Therefore, by coupling the output voltage signal $V_{R2}$ from the waveform generator 610 and the output voltage signal $V_{R1}$ from the output generator 620 to the voltage-to-current converter 630, an output current waveform is generated that is identical in shape to one of the output voltage waveforms generated by the voltage waveform generator 610 and the voltage waveform generator 620.

Figure 7:
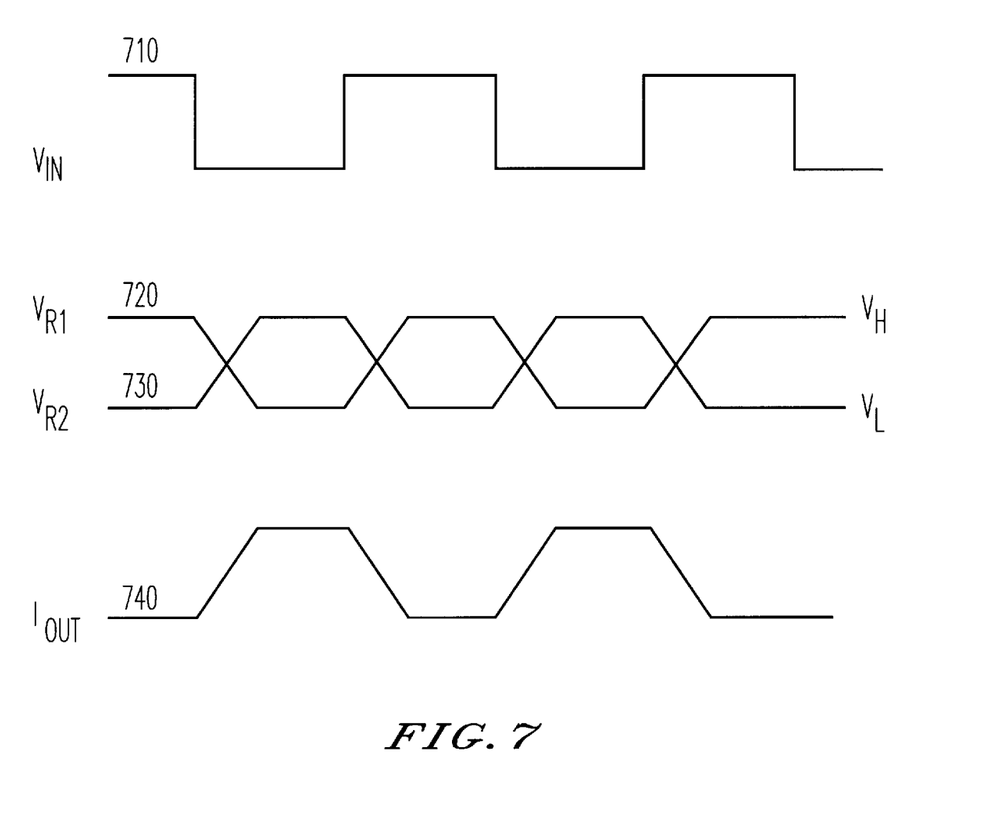
FIG. 7 is an illustration of the input and output waveforms of the circuit in FIG. 6.

FIG. 7 illustrates the input voltage signal $V_{IN}$ shown by waveform 710, the output voltage signal $V_{R2}$ shown by waveform 730, the output voltage signal $V_{R1}$ shown by waveform 720, and the output current signal $I_{out}$ shown by waveform 740. As shown in FIG. 7, the input voltage waveform 710 is a rectangular waveform. The output voltage waveforms 720 and 730 correspond to the output voltage signals $V_{R1}$ and $V_{R2}$, respectively. The output voltage waveforms 720 and 730 are both trapezoidal-shaped waveforms that have a high voltage level $V_H$ and a low voltage level $V_L$. However, the output voltage waveform 720 and the output voltage waveform 730 have complementary phases which are 180° out of phase. The output current waveform 740 is identical in shape to the output voltage waveform 730.

In the foregoing description, the invention has been described with reference to specific exemplary embodiments thereof. It will, however, be evident that various modifications and changes may be made thereto without departing from the broader spirit or scope of the present invention as defined in the appended claims. The specification and drawings are, accordingly, to be regarded in an illustrative rather than a restrictive sense.

I claim:

1. An apparatus for generating a voltage waveform, comprising:
    a first current source having an input coupled to a first voltage terminal and an output coupled to a node;
    a second current source having an input coupled to said node and an output coupled to a second voltage terminal;
        at least one of said first current source and said second current source further having an enable input for receiving an input voltage signal to control current generation by said at least one of said first and second current sources in response to said input voltage signal;
        wherein one of said first and second current sources when enabled generates a current which flows into said node and the other of said first and second current sources when enabled generates a current which flows away from said node;
    a capacitor coupled to said node and to a third voltage terminal wherein said capacitor charges or discharges in response to the total amount of the current flowing into or out of said capacitor; and
    a clamping circuit having an input for receiving a clamping voltage signal and an output coupled to said node, said clamping circuit limiting the voltage at said node to a maximum and minimum value, wherein said clamping circuit includes a first diode and a second diode wherein an input of said clamping circuit is coupled to a first end of said first diode and a second end of said second diode, and an output of said clamping circuit is coupled to a second end of said first diode and a first end of said second diode, said input of sad clamping circuit receives said clamping voltage signal and generates a voltage signal at said node.

2. The apparatus of claim 1, wherein said second voltage terminal and said third voltage terminal are coupled to ground.

3. The apparatus of claim 1, wherein said first current source and said second current source when enabled generate different amounts of current.

4. The apparatus of claim 1, comprising:
    said first current source continuously generating current flowing into said node;
    said second current source enabled by said input voltage signal and generating current flowing away from said node only when enabled by said input voltage signal, wherein the current generated by said second current source when the second current source is enabled by said input voltage signal is greater in absolute value than the current continuously generated by said first current source; and an output coupled to said node to provide an output voltage signal.

5. A method for generating a waveform, comprising the steps of:
    (a) receiving an input voltage signal having a pulse waveform to enable or disable a first current source such that the first current source generates a first current that flows in a first direction with respect to a node when enabled and does not generate current when not enabled;
    (b) continuously generating from a second current source a second current that flows in a second direction with respect to said node both when said first current source is enabled and generating said first current and when said first current source is not enbabled and not generating said first current, said second current having a magnitude less than that of said first current generated by said first current source when said first current source is enabled so that a net current flows in a first direction with respect to said node when said first current source is enabled and in a second direction, opposite to said first direction, with respect to said node when said first current source is not enabled, said first direction being one of into said node and out of said node and said second direction being the other of into said node and out of said node;
    (c) charging a capacitor connected to said node when the net current from said first and second current sources flows into said node and discharging said capacitor when said net current flows away from said node;
    (d) limiting the minimum and maximum voltage at said node by using a first diode connected in an anti-parallel relationship to a second diode; and
    (e) outputting a voltage signal having a trapezoidal waveform.

6. An apparatus for generating a voltage waveform, comprising:
    a first current source coupled between a first voltage terminal and a node;
    a second current source coupled between a secont voltage terminal and said node;
        one of said first current source and said second current source having an enable input for receiving an input voltage signal to control current generation by said at least one of said first and second current sources in response to said input voltage signal, the other of said current sources continuously generating current both when said one current source is enabled and when said one current source is not enabled;
        wherein said first and second current sources, when said one current source is enabled, generate currents in different directions with respect to said node, with said one current source generating a current larger in magnitude than the other current source, so that when said one current source is enabled, a net current flows in a first direction with respect to said node and when said one current source is not enabled, a net current flows in a second direction opposite to said first direction with respect to said node, said first direction being one of into said node and out of said node and said second direction being the other of into said node and out of said node;
    a capacitor coupled to said node and to a third voltage terminal wherein said capacitor charges or discharges in response to the net current flowing into or out of said capacitor; and a clamping circuit having an input for receiving a clamping voltage signal, an output coupled to said node, and antiparallel connected diodes connected between said input and said output, said clamping circuit limiting the voltage at said node to a maximum and minimum value.

7. The apparatus of claim 6, wherein said second voltage terminal and said third voltage terminal are coupled to ground.

8. The apparatus of claim 1, comprising:

said first current source generating current that flows into said node in response to said input voltage signal;

said second current source generating current that flows away from said node in response to said input voltage signal; and an output coupled to said node to provide an output voltage signal, said output voltage signal having a trapezoidal waveform.

9. The apparatus of claim 8, wherein said second voltage terminal said third voltage terminal are coupled to ground.

10. The apparatus of claim 1, wherein said first and second current sources each have an enable input and generate the same amount of current when enabled.

* * * * *